United States Patent
Nakagawa (10) Patent No.: US 9,027,735 B2
(45) Date of Patent: May 12, 2015

(54) TRANSPORT DEVICE (75) Inventor: Masayuki Nakagawa, Nagoya (JP)

(73) Assignee: Daifuku Co., Ltd., Osaka (JP)

( * ) Notice: Subject to any disclaimer, the term of this patent is extended or adjusted under 35 U.S.C. 154(b) by 679 days.

(21) Appl. No.: 13/232,295

(22) Filed: Sep. 14, 2011

(65) Prior Publication Data
US 2012/0067704 A1 Mar. 22, 2012

(30) Foreign Application Priority Data
Sep. 16, 2010 (JP) .................................. 2010-208283

(51) Int. Cl.
*B65G 29/00* (2006.01)
*H01L 21/677* (2006.01)

(52) U.S. Cl.
CPC ......... *H01L 21/67733* (2013.01); *Y10S 414/14* (2013.01)

(58) Field of Classification Search
CPC .......... B65G 47/61; B65G 2814/0307; H01L 21/67769
USPC ......... 198/465.4, 460.2, 678.1, 680; 414/626, 414/937, 940, 217
See application file for complete search history.

(56) References Cited

U.S. PATENT DOCUMENTS

| 5,842,824 A * | 12/1998 | Nishi ....................... 414/225.01 |
| 6,238,283 B1 | 5/2001 | Matsuyama et al. |
| 7,153,079 B2 | 12/2006 | Miyano et al. |
| 2004/0253087 A1 | 12/2004 | Iizuka |

FOREIGN PATENT DOCUMENTS

| JP | 200177170 A | 3/2001 |
| JP | 2001077170 A | 3/2001 |
| JP | 2004277066 A | 10/2004 |
| JP | 2004345756 A | 12/2004 |
| JP | 2005327927 A | 11/2005 |
| JP | 4276810 B2 | 6/2009 |

* cited by examiner

*Primary Examiner* — Gene Crawford
*Assistant Examiner* — Lester Rushin
(74) *Attorney, Agent, or Firm* — The Webb Law Firm (57) ABSTRACT

A transport device includes a traveling holding member which can travel while holding a storage container, and a move out prevention mechanism which prevents substrates from moving out of an opening of the storage container. The move out prevention mechanism is configured to include a contacting member which can be moved between a contact position at which the contacting member is in contact with side faces of the substrates, and a spaced apart position at which the contacting member is spaced apart from the side faces of the substrates. The contact position is set such that the contacting member is located between an opening side end portion and a central portion of the substrates in a direction along which the substrates are inserted and removed.

16 Claims, 7 Drawing Sheets

TRANSPORT DEVICE

BACKGROUND OF THE INVENTION

1. Field of the Invention

The present invention relates to a transport device comprising a traveling holding member which can travel while holding a storage container for storing disc-shaped substrates such that the substrates are layered in a vertical direction, said storage container having an opening formed in one side thereof for inserting and removing the substrates, and a move out prevention mechanism that prevents the substrates from moving out of the opening of the storage container held by the traveling holding member.

2. Description of the Related Art

Transport devices such as one described above transport a storage container by causing a traveling holding member holding the storage container to travel, and include a move out prevention mechanism for preventing substrates from moving out of an opening of the storage container when the traveling holding member is traveling.

And, an example of such a transport device in accordance with a conventional technology includes one in which its move out prevention mechanism includes a contacting member that is movable between a contact position at which the contacting member is in contact with side faces of the substrates stored in the storage container, and a spaced apart position at which the contacting member is spaced apart from the side faces of the substrates. And the contact position of the contacting member is set such that the contacting member extends from a location inward of an opening side end portion of the substrates stored in the storage container to a location outward thereof in a direction along which the substrates are inserted and removed. (See, for example, JP Publication of Application No. 2001-077170.)

Thus, the transport device can travel while preventing the substrates from moving out of the storage container by causing the traveling holding member to travel with the contacting member being in the contact position. And, damage to the substrates caused by the substrates contacting the contacting member can be prevented before such damage occurs by moving the contacting member to the spaced apart position, when transferring the storage container held by the traveling holding member to the container transport target location for the container by means of transfer means provided to the transport device or an external transfer means.

In the conventional transport device described above, when the contacting member is moved to the contact position, the contacting member is positioned such that it extends from a location inward of the opening side end portion of the substrates to a location outward thereof in the direction along which the substrates are inserted and removed. With the contacting member extending to a location outward of the opening side end portion of the substrates when the contacting member is moved to the contact position as described, the width of the transport device, in the direction along which the substrates are inserted and removed with the contacting member having been moved to the contact position, tends to be greater than otherwise by the amount that the contacting portion extends outwardly of the opening side end portion of the substrate, making it difficult to reduce the dimension of the transport device in the direction in which the substrates are inserted and removed during the travel of the transport device.

SUMMARY OF THE INVENTION

The present invention was made in light of the present state of the art described above and its object is to provide a transport device in which its dimension in a direction along which the substrates are inserted and removed at the time of travel can be easily reduced.

A transport device in accordance with the present invention comprises:

a traveling holding member which can travel while holding a storage container for storing disc-shaped substrates such that the substrates are layered in a vertical direction, said storage container having an opening formed in one side thereof for inserting and removing the substrates;

a move out prevention mechanism that prevents the substrates from moving out of the opening of the storage container held by the traveling holding member;

wherein the move out prevention mechanism includes a contacting member which can be moved between a contact position at which the contacting member is in contact with side faces of the substrates stored in the storage container held by the traveling holding member, and a spaced apart position at which the contacting member is spaced apart from the side faces of the substrates, and wherein the contact position is set such that the contacting member is located between an end portion closer to the opening and a central portion of the substrates stored in the storage container in a direction along which the substrates are inserted and removed.

With this configuration, the substrates can be prevented from moving out of the opening of the storage container when the contacting member of the move out prevention mechanism is moved to the contact position, whereas damage to the substrates can be prevented when moving the storage container relative to the move out prevention mechanism when the contacting member of the move out prevention mechanism is moved to the spaced apart position.

And when the contacting member is moved to the contact position, the contacting member is located inwardly of (i.e. deeper toward the interior of the container than) the opening side end of the substrates in the direction along which the substrates are inserted and removed. Thus, since the contacting member is not located outwardly of (i.e. toward the exterior of the container with respect to) the opening side end of the substrates when the contacting member is moved to the contact position, the width of the transport device in the direction along which the substrates are inserted and removed does not tend to become large when the contacting member is moved to the contact position; thus, the dimension of the transport device at the time of travel in the direction along which the substrates are inserted and removed can be easily reduced.

Therefore, a transport device can be provided in which the substrates are prevented from moving out and in which the dimension of the transport device at the time of travel in the direction along which the substrates are inserted and removed can be easily reduced.

A transport device in accordance with the present invention may also comprise:

a travel member having a holding portion for holding a storage container for storing disc-shaped substrates such that the substrates are layered in a vertical direction, said storage container having an opening formed in one side thereof for inserting and removing the substrates;

a contacting member which is formed to have a vertically extending bar shape, and which can be moved between a contact position at which the contacting member is in contact with side faces of the substrates stored in the storage container held by the holding portion, and a spaced apart position at which the contacting member is spaced apart from the side faces of the substrates, wherein the contacting member in the contact position is located between an end portion closer to the opening and a central portion of the substrates stored in the storage container in a direction along which the substrates are inserted and removed; and wherein a moving operation mechanism that is connected to the contacting member, and that moves the contacting member to the contact position and to the spaced apart position.

DESCRIPTION OF THE PREFERRED EMBODIMENTS

The preferred embodiment of the present invention is described next with reference to the drawings.

Figure 1:
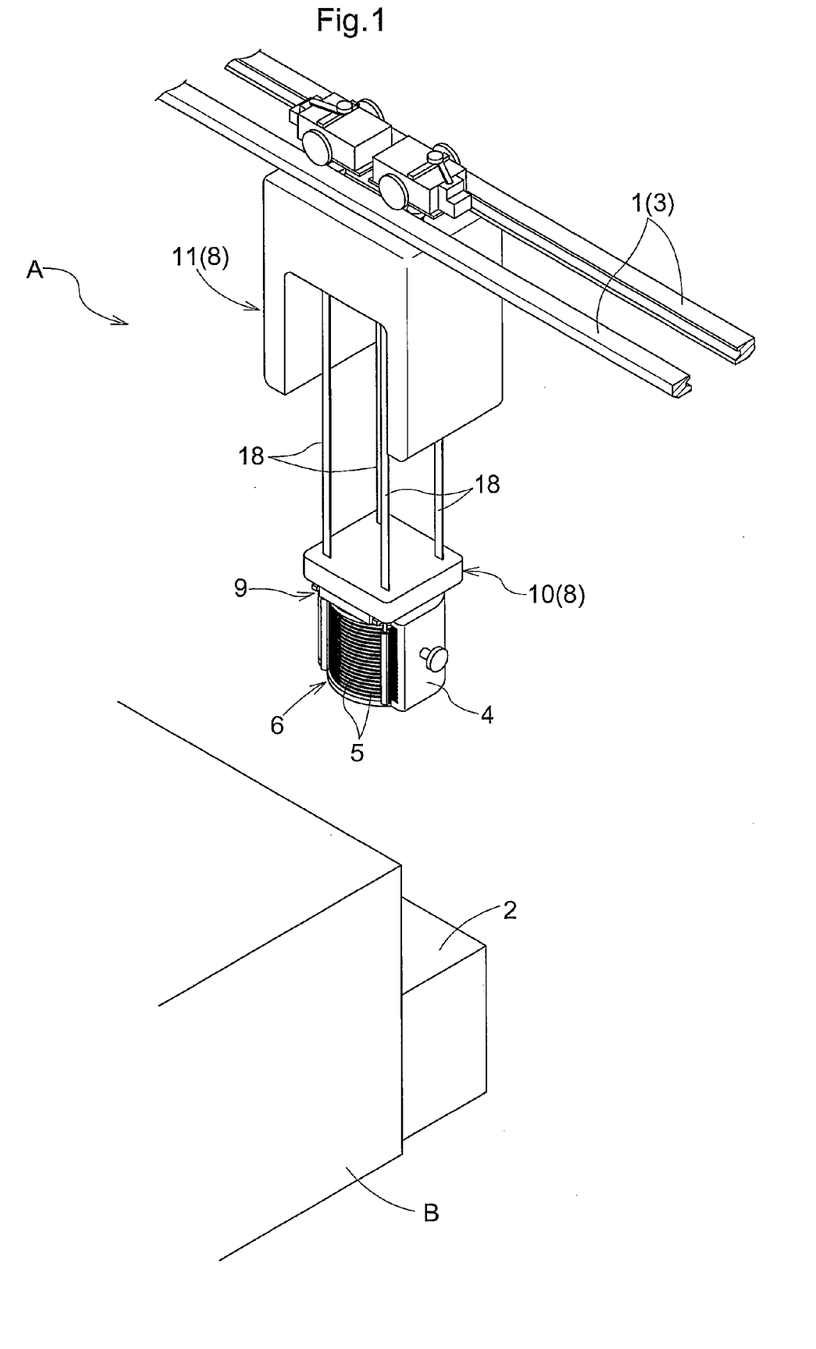
FIG. 1 is a perspective view showing a ceiling transport vehicle and a processing device in accordance with an embodiment of the present invention.

As shown in FIG. 1, a plurality of ceiling transporting vehicles A which function as transport devices are provided such that they are guided and supported by the travel rail 1 installed to a ceiling. And each ceiling transporting vehicle A is configured to travel along a travel path 3 which extends by way of or adjacent to locations above container transport target locations 2 to transport a storage container 4 for storing substrates 5. The container transport target locations 2 are locations to which storage containers 4 are transported. And one container transport target location is provided to each processing device B for processing the substrates 5 taken out from the storage container 4. In the present example, the container transport target location 2 is located adjacent to a processing device B in a width direction (path width direction) which is perpendicular to a travel direction (i.e. a direction along the travel path 3).

Figure 2:
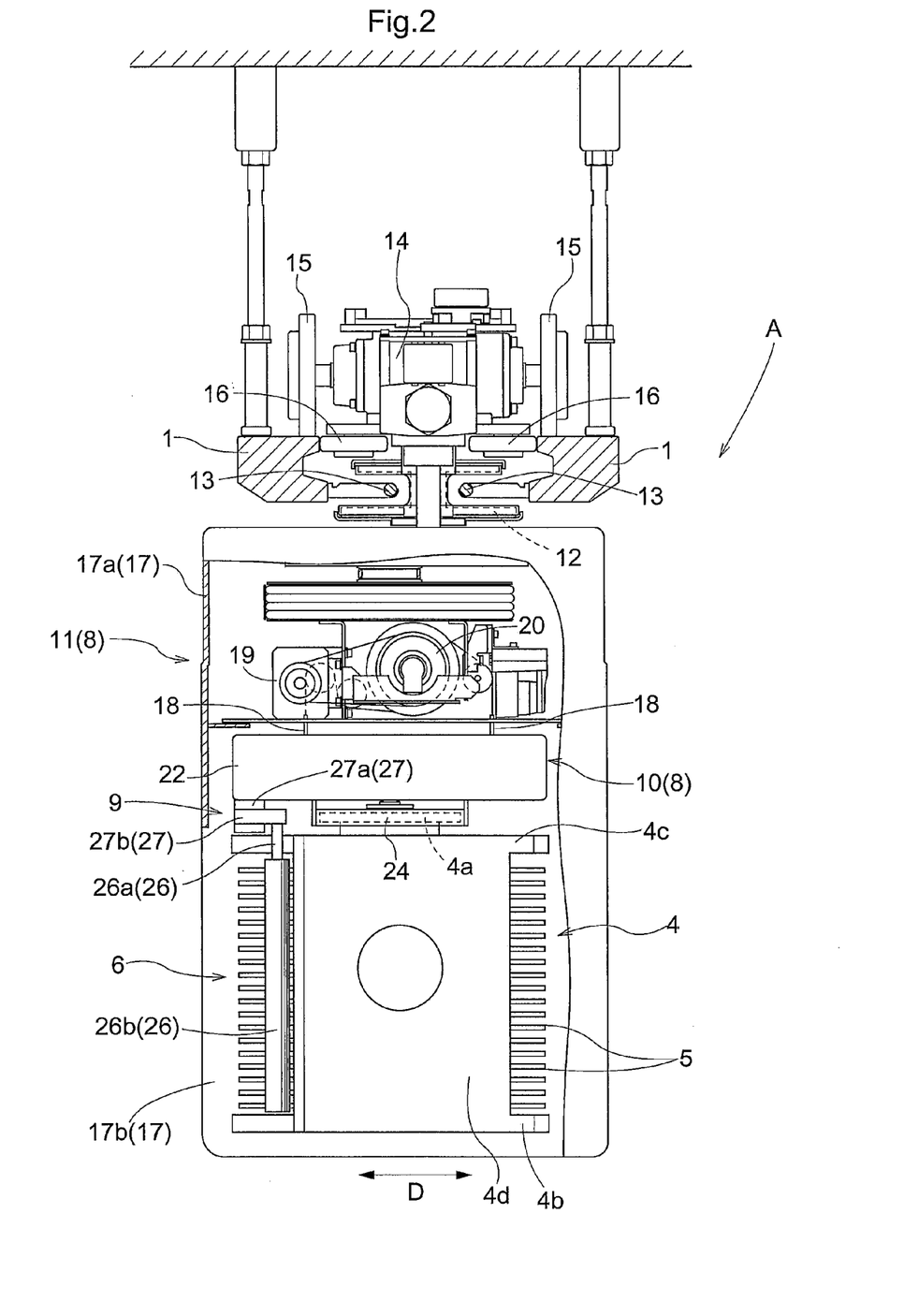
FIG. 2 is a front view of the ceiling transport vehicle in accordance with the embodiment of the present invention.
Figure 3:
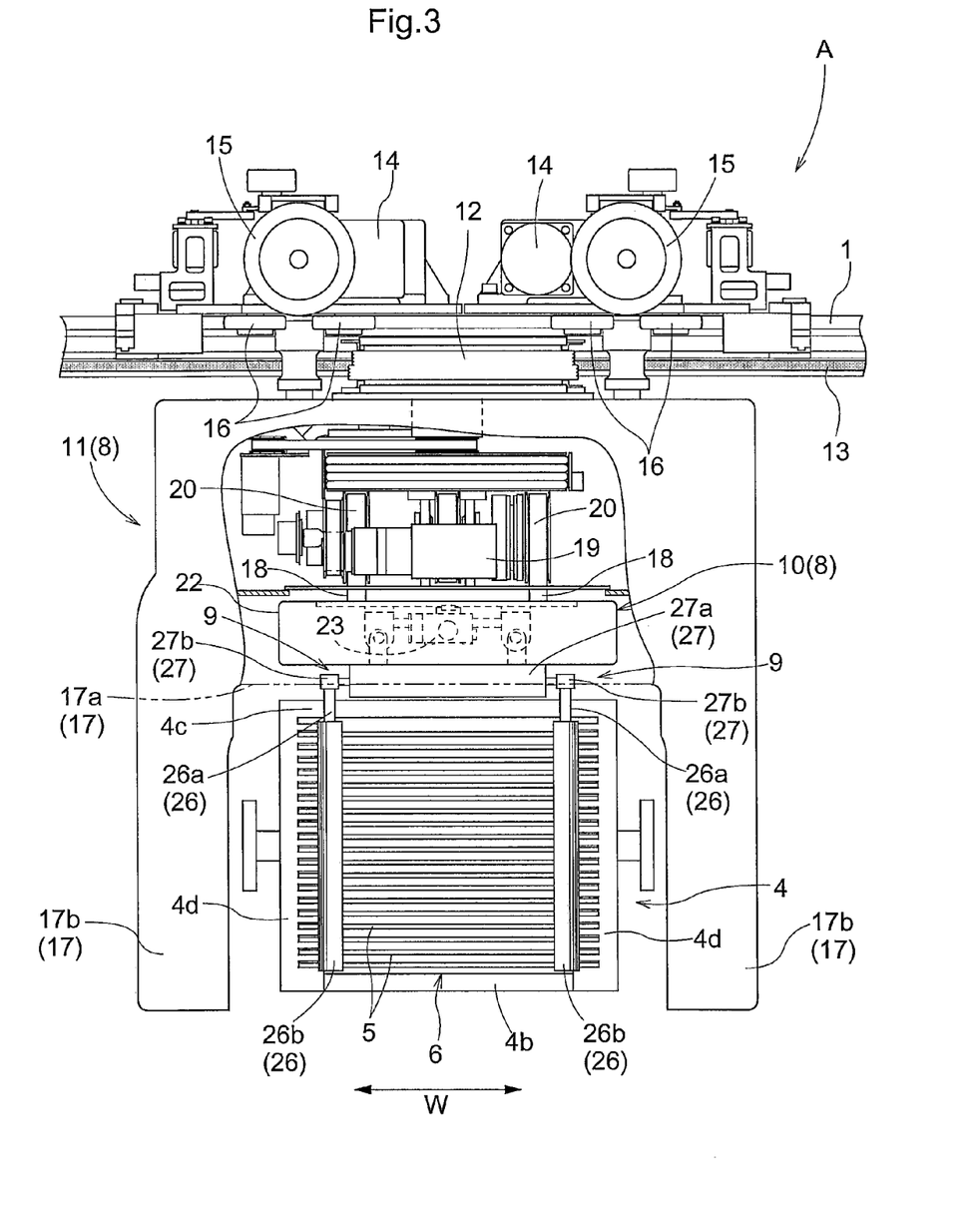
FIG. 3 is a side view of the ceiling transport vehicle in accordance with the embodiment of the present invention.
Figure 4:
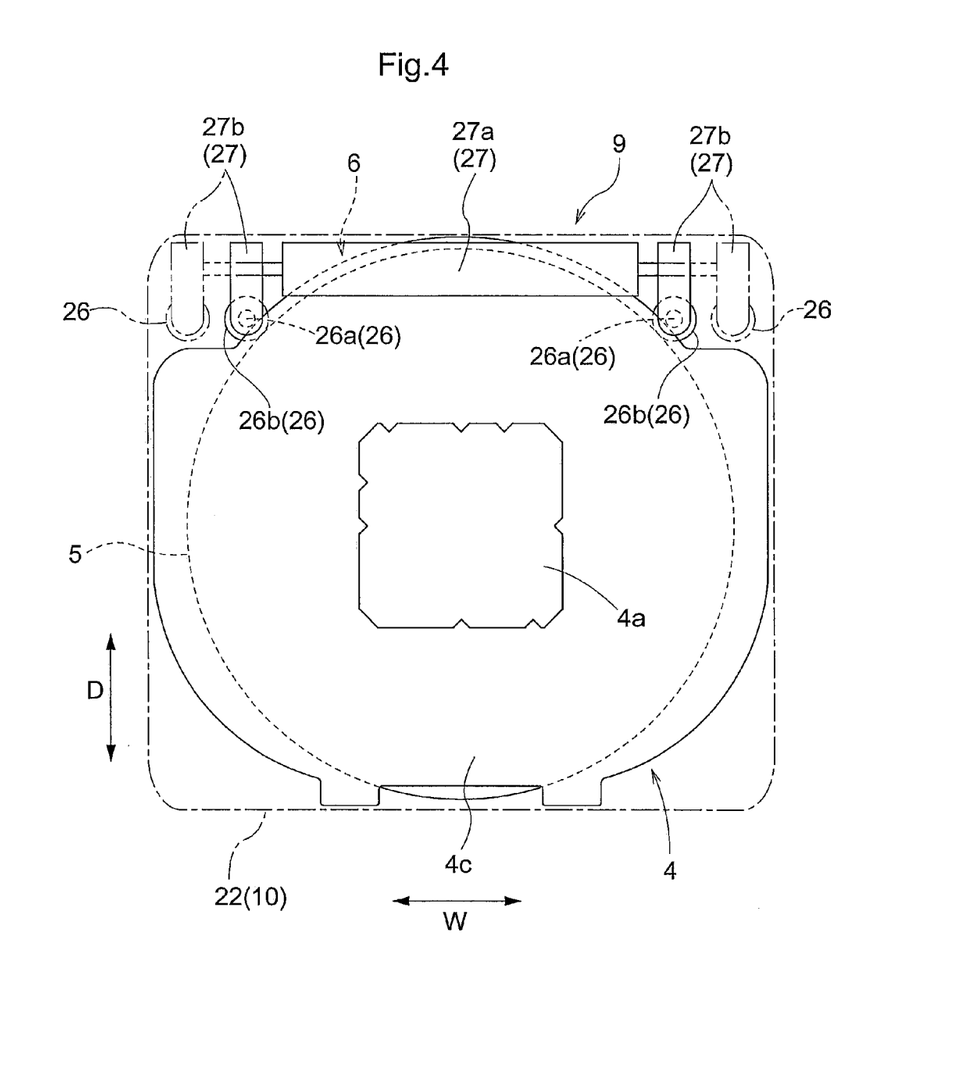
FIG. 4 is a plan view of a storage container and a contacting member in accordance with the embodiment of the present invention.

As shown in FIGS. 2-4, each storage container 4 to be transported by the ceiling transporting vehicle A stores disc-shaped substrates 5, such as wafers, such that the substrates are layered and spaced apart from each other in the vertical direction, and is an open cassette having an opening 6 formed in one side for inserting and removing the substrates.

To describe in more detail, the storage container 4 includes a bottom plate 4b and a top plate 4c having a diameter which is (slightly, in the present example) greater than that of the substrates 5 with the bottom plate 4b and the top plate 4c connected by a side wall 4d and with the opening 6 for inserting and removing the substrates being formed in the side face on the front side. And the substrates 5 are stored (in other words, housed) in the storage container 4 such that the substrates are supported by the side wall 4d and layered and spaced apart from each other in the vertical direction. The substrates 5 are removed from and inserted into the storage container 4 through the opening 6. Incidentally, the side wall 4d extends from lateral sides of the stored substrates 5 to the back thereof: the side wall 4d prevents the substrates 5 from moving out from the back and lateral sides of the storage container 4. In addition, the storage container 4 has no lid for closing the opening 6.

The ceiling transport vehicle A includes a traveling holding member 8 (travel member) which can travel while holding a storage container 4, and a move out prevention mechanism 9 for preventing the substrates 5 from moving out of the opening 6 of the storage container 4 held by the traveling holding member 8.

The traveling holding member 8 includes a holding portion 10 for holding the storage container 4, and a travel portion 11 which can travel and which supports the holding portion 10 such that the holding portion can be moved vertically. The traveling holding member 8 is configured to transport the storage container 4 to container transport target locations 2 by traveling of the travel portion 11 and vertical movement of the holding portion 10.

As shown in FIG. 1, the traveling holding member 8 is configured to hold the storage container 4 with the opening 6 oriented in or facing a lateral direction which intersects the travel direction (perpendicularly in the present example), and to hold the storage container 4 with the opening 6 facing toward the processing device B when the traveling holding member 8 is located directly above the container transport target location 2.

Thus, with the traveling holding member 8 holding the storage container 4 with the opening 6 facing the lateral direction, the direction D along which the substrates 5 are inserted and removed coincides with the lateral direction which is perpendicular to the travel direction of the traveling holding member 8. And the width direction W which is perpendicular to the direction D along which the substrates are inserted and removed coincides with the travel direction of the traveling holding member 8.

As shown in FIG. 2, provided to the upper portion of the travel portion 11 are driven wheels 15 which are rotated by a travel motor 14 and which roll on upper surfaces of the travel rail 1, and guiding wheels 16 which are in contact with side faces of the travel rail 1 and which can rotate freely. And, the travel portion 11 is configured to be guided by the travel rail 1 and to travel along the travel path 3 by virtue of the fact that the driven wheels 15 are drivingly rotated by the travel motor 14 and the guiding wheels 16 are contacted and guided by the travel rail 1.

Provided to a vertical intermediate portion of the travel portion 11 is a power receiving coil 12. Magnetic field is generated by applying alternating current to the electricity supply lines 13 arranged along the travel path 3 and the electric power required by the ceiling transport vehicle A is generated by this magnetic field; thus, the electric power is contactlessly supplied to the ceiling transport vehicle A.

As shown in FIG. 3, a cover body 17 provided in the lower portion of the travel portion 11 is formed to have a downwardly opening bracket shape or an inverted U-shape in a side view with an upper cover portion 17a extending in the travel direction and a pair of front and back cover portions 17b extending downwardly from respective ends of the upper cover portion 17a in the travel direction. As shown in FIG. 2, each of the upper cover portion 17a and the pair of front and back cover portions 17b has its width in the lateral direction which is greater than the width of the storage container 4 in the lateral direction so that the storage container 4 held by the holding portion 10 does not project from the cover body 17 in the lateral direction (direction D along which the substrates are inserted and removed).

Figure 5A:
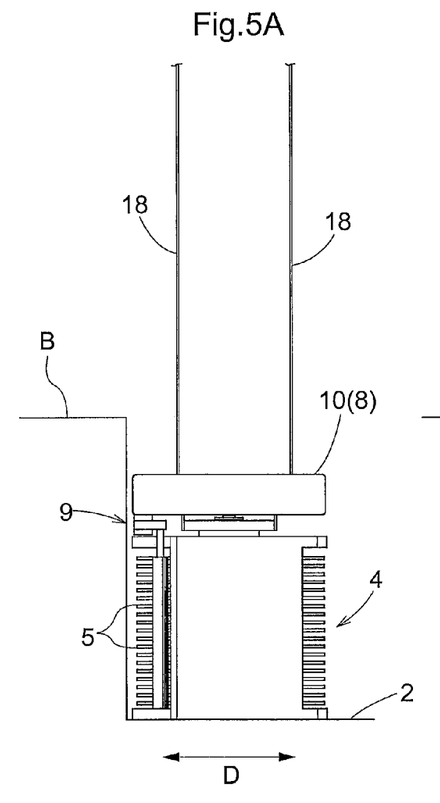
FIG. 5A and FIG. 5B are front views of the storage container located at a container transport target location in accordance with the embodiment of the present invention.
Figure 5B:
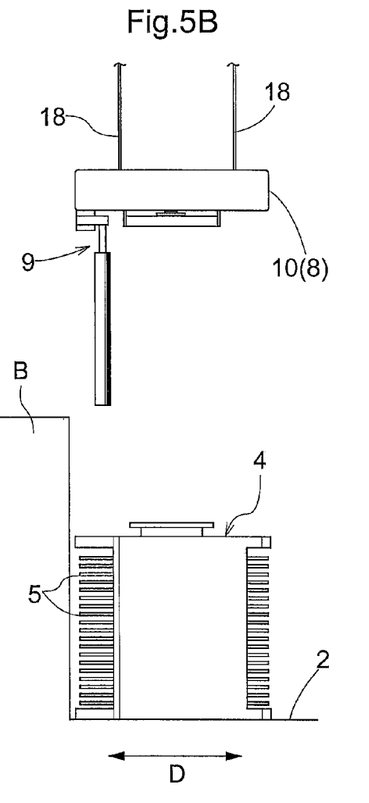

Further, provided to the lower portion of the travel portion 11 is a rotation drum 20 which is rotated by a vertical movement motor 19 and which spools wires 18, to the lower ends of which the holding portion 10 is connected. And, the holding portion 10 suspended and supported by the travel portion 11 is configured to be vertically moved, by actuating and rotating the rotation drum 20 by the vertical movement motor 19, between a travel position (located in the space surrounded by the cover body 17 in the present example: see FIGS. 2 and 3) in which the holding portion 10 is located close to the travel portion 11, and a transfer position (see FIG. 5A) located downwardly from the travel position for transferring (i.e. delivering and receiving) the storage container 4 to or from the container transport target location 2.

As shown in FIGS. 2 and 3, the holding portion 10 includes a main body portion 22 connected to the lower ends of the wires 18, and a grip portion actuated by a gripper motor 23. In the present example, the grip portion comprises a pair of grip claws 24 which are actuated and pivoted by the gripper motor 23. The pair of grip claws 24 are supported by the main body portion 22 such that each of the grip claws 24 is pivotable about an axis extending in the lateral direction (i.e. direction D along which the substrates are inserted and removed), and such that the grip claws 24 project downwardly from the main body portion 22 and are arranged next to each other in the travel direction (width direction W).

And, although illustration is omitted, by actuating and pivoting the pair of grip claws 24 by the gripper motor 23, the grip claws 24 are configured to be switched between a gripping attitude in which the pair of grip claws 24 are caused to move toward each other to grip a flange portion 4a provided in the upper surface of the top plate 4c of the storage container 4, and a grip release attitude in which the pair of grip claws 24 are moved away from each other to release the grip on the storage container 4.

As shown in FIG. 2, the width of the main body portion 22 in the lateral direction is set to be less than the width of the cover body 17 in the lateral direction, and the width of the grip claw 24 in the lateral direction is set to be less than the width of the main body portion 22 in the lateral direction. In addition, the widths of the main body portion 22 in the lateral direction and in the travel direction (see FIG. 3) are set to be equal to the widths of the storage container 4 in the lateral direction and in the travel direction respectively.

The move out prevention mechanism 9 is supported by the holding portion 10 in the present embodiment. This move out prevention mechanism 9 is configured to include contacting members 26 which can be moved between contact positions (positions shown by solid lines in FIG. 4) at which the contacting members are in contact with side faces of the substrates 5 stored in the storage container 4 held by the holding portion 10 of the traveling holding member 8, and spaced apart positions (positions shown by phantom lines in FIG. 4) at which the contacting members are horizontally spaced apart from the side faces of the substrates 5.

To describe the move out prevention mechanism 9 in more detail, as shown in FIGS. 3 and 4, the move out prevention mechanism 9 is configured to include a pair of contacting members 26 with one and the other of the pair of the contact members 26 located on one and the other side respectively of a central location or part of the substrates 5 stored in the storage container 4 in the travel direction (width direction W), and a cylinder device 27 that functions as a moving operation mechanism for moving the pair of contacting members 26 toward each other along the travel direction to move them to the contact positions and for moving the pair of contacting members 26 away from each other along the travel direction to move them to the spaced apart positions. This cylinder device 27 corresponds to an actuator for moving the contacting members 26 to the contact positions and to the spaced apart positions.

The cylinder device 27 includes a connecting rod 27b (movable portion) projecting from each of both ends of the cylinder main body 27a in the longitudinal direction thereof. And one contacting member 26 is connected to each of the pair of connecting rods 27b. The pair of connecting rods 27b are configured to be projected from and retracted into the cylinder main body 27a to move the pair of contacting members 26 toward each other and away from each other.

As shown in FIG. 3, the cylinder device 27 is installed on the undersurface side of the main body portion 22 so that it extends in or is oriented along the travel direction. The length of the cylinder device 27 in the longitudinal direction is shorter than the width of the main body portion 22 in the travel direction, and the cylinder device 27 is installed such that the cylinder device 27 does not project from the main body portion 22 in the travel direction (the width direction W). As shown in FIGS. 1 and 4, the cylinder device 27 is located at a position in the main body portion 22 between the end portion thereof closer to the laterally facing opening and the grip claws 24 in the lateral direction such that the cylinder device 27 does not project from the main body portion 22 in the lateral direction (the direction D along which the substrates are inserted and removed).

As shown in FIGS. 2-4, each of the pair of connecting rods 27b of the cylinder device 27 extends outwardly in the travel direction from the cylinder main body 27a, and is formed in a shape that extends, from its distal end, inwardly (i.e. in the direction opposite from the opening side) toward where the substrates 5 are located. And each contacting member 26 is connected to the lower end of the portion of the connecting rod 27b that extends inwardly.

As shown in FIG. 4, each contacting member 26 includes a bar-shaped axis portion 26a made of hard resin material with a high degree of hardness, and a contacting portion 26b which is made of softer resin material with a lower degree of hardness than the axis portion 26a and which covers the periphery of the side of (or surrounds) the axis portion 26a. The connecting rod 27b is connected to the axis portion 26a and the contacting portion 26b is configured to contact the side faces of the substrates 5.

And the contact position for each contacting member 26 is set to be located, in the lateral direction (direction D along which the substrates are inserted and removed), between the end portion closer to the laterally facing opening (i.e. opening side end portion) and the central portion of the substrates 5 stored in the storage container 4 on the one hand, and in the travel direction (the width direction W), between the corresponding end portion and the central portion of the substrates 5 stored in the storage container 4 in the travel direction, on the other hand.

And the spaced apart position for each contacting member 26 is set to be located between the end portion closer to the laterally facing opening and the central portion of the substrates 5 stored in the storage container 4 in the lateral direction (direction D along which the substrates are inserted and removed). In the present example, the spaced apart position of each contacting member 26 is set to be at the same location as the corresponding end portion, in the travel direction, of the substrates 5 stored in the storage container 4.

That is, each contacting member 26 is located, in the lateral direction, between the end portion closer to the laterally facing opening and the central portion of the substrates 5 stored in the storage container 4, and is moved to the contact position and to the spaced apart position by being moved along the travel direction in an area between the corresponding end portion and the central portion of the substrates 5 in the travel direction. Also, it is also possible to set the spaced apart position for the contacting member 26 to be positioned outward (i.e. farther away from the central portion of the substrates 5) of the end portion, in the travel direction, of the substrates 5 stored in the storage container 4.

The vertical length of each contacting portion 26b is set to be greater than the distance between the highest and the lowest of the substrates 5 that are stored in the storage container 4 such that they are layered and spaced apart from each other, and also to be less than the distance between the bottom plate 4b and the top plate 4c. In addition, the contacting portion 26b is formed to have a greater diameter than that of (or is thicker than) the axis portion 26a.

Therefore, when the contacting members 26 are moved to the contact positions, the axis portions 26a are moved to locations close to the top plate 4c. And the contacting portions 26b are moved to within the storage container through the opening 6 and contact all the substrates 5 stored in the storage container 4.

And when the contacting members 26 are moved to the spaced apart positions, the axis portions 26a are moved away from the top plate 4c. And the entire contacting portions 26b are moved out of the storage container through the opening 6.

Figure 6:
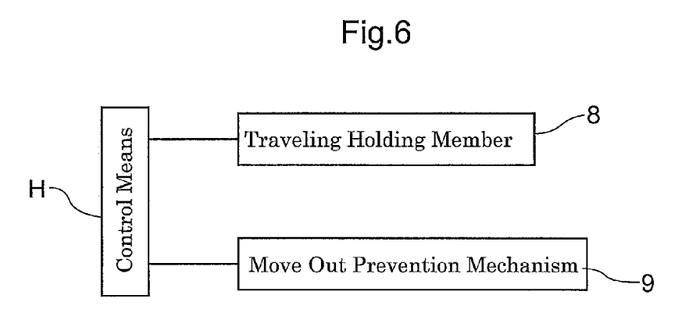
FIG. 6 is a control block diagram in accordance with the embodiment of the present invention.

As shown in FIG. 6, control means H (control device) for controlling the operations of the traveling holding member 8 and the move out prevention mechanism 9 is provided. The control means H includes a CPU, memory, a communication unit, etc., and the algorithms for executing the functions described in the present specifications are stored in the memory.

When receiving a storage container 4 located in the container transport target location 2, the control means H is configured to cause the traveling holding member 8 that does not hold any storage container 4 to travel to a stop position corresponding to the container transport target location 2. Thereafter, the control means H is configured to control the operation of the traveling holding member 8 to cause the holding portion 10 to be lowered to the transfer position, and the grip claws 24 to be switched to the gripping attitude to grip the storage container 4 located in the container transport target location 2, and thereafter the holding portion 10 to be raised to the travel position. In addition, the control means H is configured to control the operation of the move out prevention mechanism 9 to move the contacting members 26 to the contact positions from the spaced apart positions before (for example, immediately before) raising the holding portion 10 to the travel position or during the raising. That is, the control means H causes the contacting members 26 to be moved to the contact positions from the spaced apart positions when the holding portion 10 is at a lower position than the travel position.

And when delivering a storage container 4 to the container transport target location 2, the control means H is configured to cause the traveling holding member 8 that holds the storage container 4 to travel to a stop position corresponding to the container transport target location 2. Thereafter, the control means H is configured to control the operation of the traveling holding member 8 to cause the holding portion 10 to be lowered to the transfer position, and the grip claws 24 to be switched to the grip releasing attitude to unload the storage container 4 to the container transport target location 2, and thereafter the holding portion 10 to be raised to the travel position. And the control means H is configured to control the operation of the move out prevention mechanism 9 to move the contacting members 26 from the contact positions to the spaced apart positions during the lowering of the holding portion 10 to the transfer position or after (for example, immediately after) the completion of lowering. That is, the control means H causes the contacting members 26 to be moved from the contact positions to the space apart positions when the holding portion 10 is at a lower position than the travel position.

Thus, by setting the contact positions and the spaced apart positions for the contacting members 26 such that the contacting member 26 (more specifically, the entirety of the contacting member 26) is located between the end portion closer to the laterally facing opening and the central portion of the substrates 5 stored in the storage container 4 in the lateral direction, the contacting member 26 does not extend to the opening side (outward) with respect to the opening side end portion of the substrates 5 in the lateral direction. Therefore, this configuration makes it easier to reduce the width of the ceiling transport vehicle A in the lateral direction (direction D along which the substrates are inserted and removed). And when lowering a storage container 4 to the container transport target location 2, the storage container 4 can be lowered to a position close to the processing device B, making it easier to transfer the substrates 5 between the storage container 4 and the processing device B.

Alternative Embodiments (1) In the embodiment described above, the move out prevention mechanism 9 is supported by the holding portion 10. However, the move out prevention mechanism 9 may be supported by the travel portion 11 instead.

Figure 7:
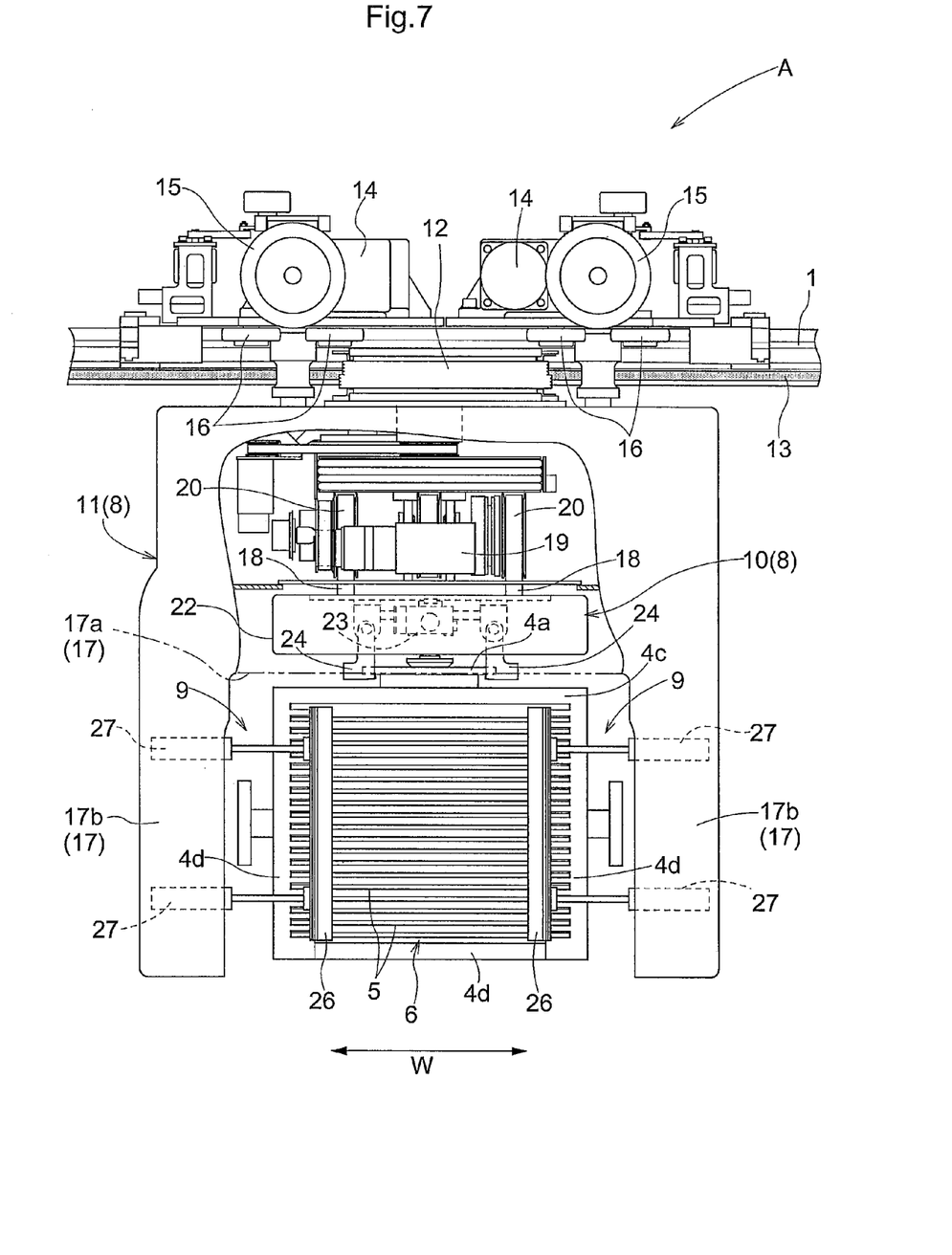
FIG. 7 is a side view of the ceiling transport vehicle in accordance with the alternative embodiment (1) of the present invention.

More specifically, as shown in FIG. 7, a cylinder device 27 may be provided, for example, to each of the pair of front and back cover portions 17b of the cover body 17 with a contacting member 26 being connected to each cylinder device 27 so that the cylinder devices 27 may be extended and contracted to move the pair of contacting members 26 toward each other and away from each other.

(2) In the embodiment described above, the contacting members 26 are moved from the contact positions to the spaced apart positions and vice versa when the holding portion 10 is located at a lower location than the travel position. However, the contacting members 26 may be moved from the contact positions to the spaced apart positions and vice versa when the holding portion 10 is located in the travel position instead.

More specifically, for example, the control means H may be configured to control the operation of the move out prevention mechanism 9 to move the contacting members 26 from the contact positions to the spaced apart positions after the traveling holding member 8 holding a storage container 4 has traveled to a stop position corresponding to the container transport target location 2 but before the lowering of the holding portion 10 to the transfer position is initiated. Also, the control means H may be configured to control the operation of the move out prevention mechanism 9 to move the contacting members 26 from the spaced apart positions to the contact positions after the holding portion 10 holding the storage container 4 is raised to the travel position, but before the traveling holding member 8 starts to travel.

(3) In the embodiment described above, the ceiling transport vehicle A is configured to carry only the open cassette.

Figure 8:
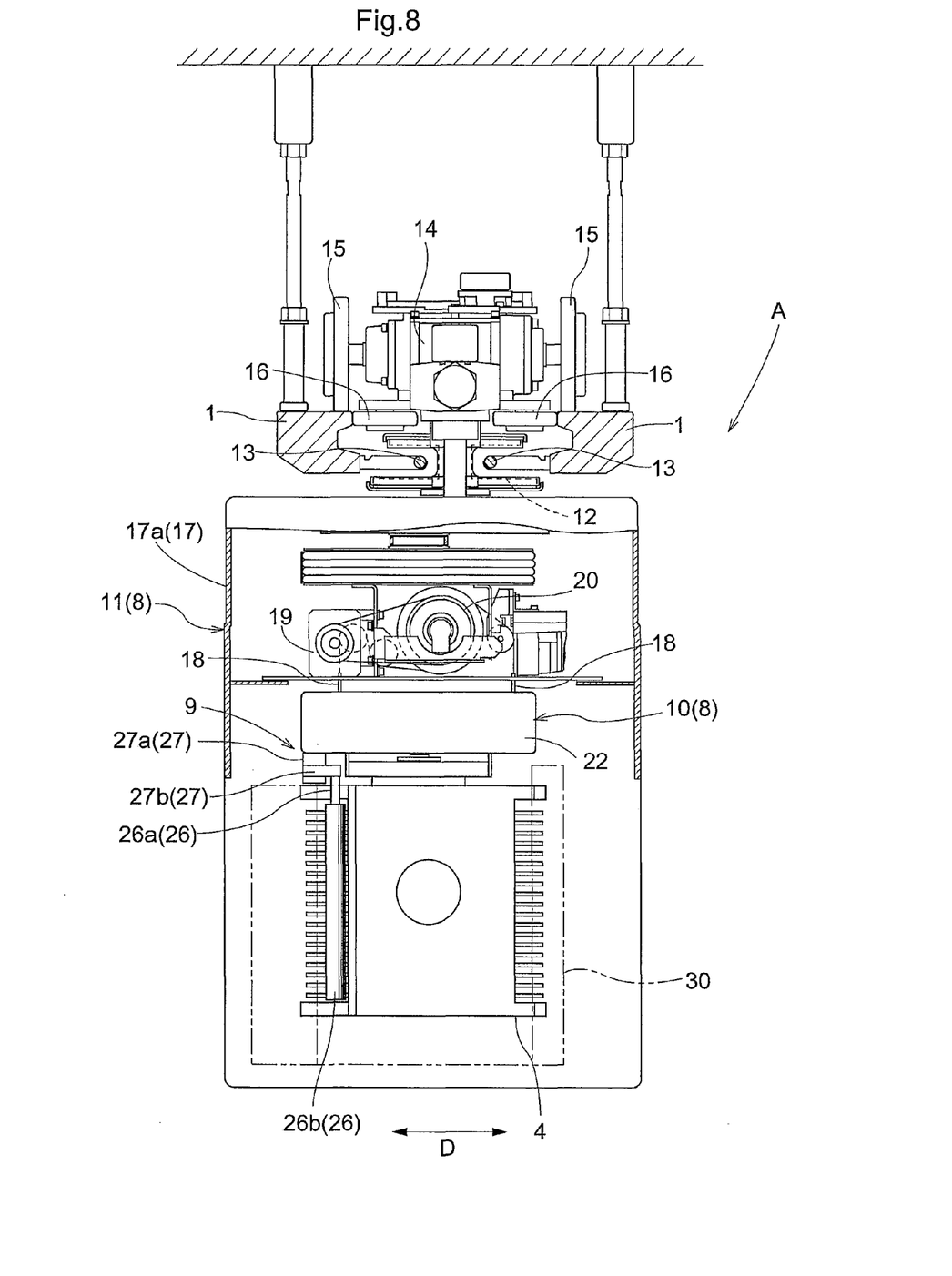
FIG. 8 is a front view of the ceiling transport vehicle in accordance with the alternative embodiment (3) of the present invention.

However, as shown in FIG. 8, the move out prevention mechanism 9 may be provided to a ceiling FOUP transport vehicle A for transporting a FOUP (Front Opening Unified Pod) 30 to provide a ceiling transport vehicle A that can transport an open cassette.

(4) In the embodiment described above, the traveling holding member 8 is configured to hold the storage container 4 with the opening 6 facing the lateral direction. However, it is also possible to configure traveling holding member 8 such that it holds the storage container 4 with the opening 6 facing the travel direction.

(5) In the embodiment described above, the move out prevention mechanism 9 is configured to include a pair of contacting members 26 with one and the other of the pair of contacting members 26 being located on one and the other side respectively of the center of the substrates 5 in the width direction W. However, the move out prevention mechanism 9 may be configured to include one contacting member 26 located on one side of the center of the substrates 5 in the width direction W.

(6) In the embodiment described above, the contacting members 26 are moved along the width direction W to move them to the respective contact positions and spaced apart positions. However, the contacting members 26 may be moved along a direction (for example, the direction D along which the substrates are inserted and removed) which intersects the width direction W to move the contacting members 26 to the respective contact positions and spaced apart positions. When a configuration in which the contacting members 26 are moved along the direction D along which the substrates are inserted and removed is adapted and if a pair of contacting members 26 are provided, the pair of contacting members 26 are moved to respective contact positions and spaced apart position without being moved toward each other or away from each other by causing the pair of contacting members 26 to be moved along the direction D along which the substrates are inserted and removed.

(7) In the embodiment described above, the move out prevention mechanism 9 is configured to include an actuator for moving the contacting members 26 from the contact positions to the spaced apart positions and vice versa. However, it is not necessary for the move out prevention mechanism 9 to have such an actuator. More specifically, the move out prevention mechanism 9 may be configured to include an operated member that is operated by an operating member provided in the container transport target location 2, and a connecting mechanism (or a linkage mechanism) for connecting the operated member to the contacting members 26. In such case, for example, the operation member may be provided that is located close to the container transport target location 2, that presses on the operated member as the holding portion 10 is lowered, and that releases the pressing on the operated member as the holding portion 10 is raised. And the connecting mechanism may be configured to be a mechanism that operatively connects the operated member to the contacting member 26, and that causes the contacting members 26 to be moved from the contact positions to the spaced apart positions when the operated member is pressed, and that causes the contacting members 26 to be moved from the spaced apart positions to the contact positions when the pressing on the operated member is released.

In addition, it becomes unnecessary to have an actuator that is used exclusively for moving the contacting members 26, by having one actuator that serves as an actuator (or the cylinder device 27) for moving the contacting members 26 from the contact positions to the spaced apart positions and vice versa, and also as an actuator (gripper motor 23) for switching the grip claws 24 between the gripping attitude and the grip release attitude.

More specifically, the contacting member 26 may be, for example, connected to the grip claws 24 such that the contacting members 26 are in the contact positions when the grip claws 24 are in the gripping attitude and such that the contacting members 26 are in the spaced apart positions when the grip claws 24 are in the grip release attitude. And the contacting members 26 are moved between the contact positions and the spaced apart positions as the attitude of the grip claws 24 is switched between the gripping attitude and the grip release attitude by the gripper motor 23.

(8) In the embodiment described above, the traveling holding member 8 is of a ceiling traveling type which is guided and supported by the travel rail 1 installed to the ceiling. However, the traveling holding member 8 may be of a floor surface travel type that self-propels on the floor surface, of another floor surface travel type that travels on the floor surface while guided by a rail installed on the floor surface, or of yet another floor surface travel type that travels on the rail top while guided and supported by the rail installed on the floor surface.

(9) In the embodiment described above, the transfer position is set to be at a lower position than the travel position, and the holding portion 10 is configured to be lowered from the travel position near the travel portion 11 to the transfer position. However, the transfer position may be set to be at a higher position than the travel position, and the holding portion 10 may be configured to be raised from the travel position near the travel portion 11 to the transfer position. Also, the transfer position may be set to be a position laterally displaced from the travel position, and the holding portion 10 may be configured to be moved laterally from the travel position near the travel portion 11 to the transfer position. Also, the holding portion 10 may be fixedly supported by the travel portion 11. And the storage container 4 may be transferred between the holding portion 10 and the container transport target location 2 by means of a container transfer device provided near the container transport target location 2.

What is claimed is:

1. A transport device comprising:
    a traveling holding member which can travel while holding a storage container for storing disc-shaped substrates such that the substrates are layered in a vertical direction, said storage container having an opening formed in one side thereof for inserting and removing the substrates; and
    a move out prevention mechanism that prevents the substrates from moving out of the opening of the storage container held by the traveling holding member;
    wherein the move out prevention mechanism is provided in the traveling holding member and includes a contacting member which can be moved between a contact position at which the contacting member is in contact with side faces of the substrates stored in the storage container held by the traveling holding member, and a spaced apart position at which the contacting member is spaced apart from the side faces of the substrates,
    wherein the contact position is set such that the contacting member is located between an end portion closer to the opening and a central portion of the substrates stored in the storage container in a direction along which the substrates are inserted and removed,
    wherein the traveling holding member includes a holding portion for holding the storage container, and a travel portion which can travel along a travel path and which supports the holding portion such that the holding portion can be moved vertically, wherein the traveling holding member is configured to transport the storage container to a container transport target location by traveling of the travel portion and vertical movement of the holding portion, and wherein the move out prevention mechanism is supported by the holding portion.

2. A transport device as defined in claim 1, wherein the traveling holding member is configured to hold the storage container with the opening being oriented to face a lateral direction which intersects a travel direction.

3. A transport device as defined in claim 1, wherein the move out prevention mechanism includes two of the contacting member with one and the other of the contacting members being located on one and the other side respectively of a central location of the substrates stored in the storage container in a width direction that perpendicularly intersects the direction along which the substrates are inserted and removed, and a moving operation mechanism for moving the contacting members toward each other along the width direction to move the contacting members to the respective contact positions and for moving the contacting members away from each other along the width direction to move the contacting members to the respective spaced apart positions.

4. A transport device as defined in claim 1, wherein the traveling holding member includes a holding portion for holding the storage container, and a travel portion which can travel and which supports the holding portion such that the holding portion can be moved vertically, wherein the traveling holding member is configured to transport the storage container to a container transport target location by traveling of the travel portion and vertical movement of the holding portion, and wherein the move out prevention mechanism is supported by the travel portion, and wherein the contacting member can be moved between the contact position and the spaced apart position when the holding portion has been vertically moved to a travel position.

5. A transport device as defined in claim 1, wherein a container transport target location which is a transport destination for the storage container is located adjacent to a processing device for processing substrates, and wherein the traveling holding member is configured to hold the storage container with the opening being oriented toward the processing device.

6. A transport device as defined in claim 1, wherein a moving operation mechanism provided to the move out prevention mechanism for moving the contacting member includes an actuator for moving the contacting member to the contact position and to the spaced apart position.

7. A transport device comprising:
a travel member having a holding portion for holding a storage container for storing disc-shaped substrates such that the substrates are layered in a vertical direction, said storage container having an opening formed in one side thereof for inserting and removing the substrates;
a contacting member which is formed to have a vertically extending bar shape, and which can be moved between a contact position at which the contacting member is in contact with side faces of the substrates stored in the storage container held by the holding portion, and a spaced apart position at which the contacting member is spaced apart from the side faces of the substrates, wherein the contacting member in the contact position is located between an end portion closer to the opening and a central portion of the substrates stored in the storage container in a direction along which the substrates are inserted and removed;
a moving operation mechanism is connected to the contacting member, and moves the contacting member to the contact position and to the spaced apart position, and
a travel portion which can travel along a travel path and is provided to the travel member and supports the holding portion such that the holding portion can be moved vertically,
wherein the contacting member and the moving operation mechanism are provided in the travel member,
wherein the holding portion is configured to be vertically moved between a travel position and a transfer position for transferrin the storage container to a container transport target location, and
wherein the moving operation mechanism is supported by the holding portion.

8. A transport device as defined in claim 7, wherein the holding portion is supported by the travel member with the opening of the storage container held by the holding portion being oriented to face a lateral direction which intersects a travel direction.

9. A transport device as defined in claim 7, wherein two of the contacting member are provided with one and the other of the contacting members being located on one and the other side respectively of a central location of the substrates stored in the storage container in a width direction that perpendicularly intersects the direction along which the substrates are inserted and removed, wherein the moving operation mechanism includes two movable portions that are projected and retracted along the width direction with one movable portion being provided on each side in the width direction for and being coupled to the respective one of the contacting members, wherein each of the contacting members is moved to the contact position by moving the movable portions toward each other along the width direction, and wherein each of the contacting members is moved to the spaced apart position by moving the movable portions away from each other along the width direction.

10. A transport device as defined in claim 7, further comprising:
a travel portion that can travel and is provided to the travel member and that supports the holding portion such that the holding portion can be moved vertically;
wherein the holding portion is configured to be vertically moved between a travel position and a transfer position for transferring the storage container to a container transport target location, wherein the moving operation mechanism is supported by the travel portion, and wherein a vertical position of the contacting member overlaps with vertical positions of the substrates stored in the storage container held by the holding portion when the holding portion is vertically moved to the travel position.

11. A transport device as defined in claim 7, wherein a container transport target location which is a transport destination for the storage container is located adjacent to a processing device for processing substrates, and wherein the holding portion is supported by the travel member with the opening of the storage container held by the holding portion being oriented toward the processing device.

12. A transport device as defined in claim 7, wherein the moving operation mechanism includes an actuator.

13. A transport device as defined in claim 1, wherein the spaced apart position is set such that the contacting member is located between the end portion of the substrates closer to the opening and the central portion of the substrates stored in the storage container in the direction along which the substrates are inserted and removed.

14. A transport device as defined in claim 7, wherein the spaced apart position is set such that the contacting member is located between the end portion of the substrates closer to the opening and the central portion of the substrates stored in the storage container in the direction along which the substrates are inserted and removed.

15. A transport device as defined in claim 1, wherein the contacting member has a curved shape protruding toward the substrates at least in a portion coming into contact with the substrates.

16. A transport device as defined in claim 7, wherein the contacting member has a curved shape protruding toward the substrates at least in a portion coming into contact with the substrates.

\* \* \* \* \*

UNITED STATES PATENT AND TRADEMARK OFFICE
CERTIFICATE OF CORRECTION

PATENT NO. : 9,027,735 B2
APPLICATION NO. : 13/232295
DATED : May 12, 2015
INVENTOR(S) : Masayuki Nakagawa Page 1 of 1

It is certified that error appears in the above-identified patent and that said Letters Patent is hereby corrected as shown below:

In the claims

Column 12, Line 15, Claim 7, delete "transferrin" and insert -- transferring --

Signed and Sealed this
Sixth Day of October, 2015

Michelle K. Lee
*Director of the United States Patent and Trademark Office*